(12) United States Patent
Fujimura et al.

(10) Patent No.: US 10,460,071 B2
(45) Date of Patent: Oct. 29, 2019

(54) SHAPED BEAM LITHOGRAPHY INCLUDING TEMPERATURE EFFECTS

(71) Applicant: D2S, Inc., San Jose, CA (US)

(72) Inventors: Akira Fujimura, Saratoga, CA (US); Harold Robert Zable, Palo Alto, CA (US); Ryan Pearman, San Jose, CA (US); William Guthrie, Santa Clara, CA (US)

(73) Assignee: D2S, Inc., San Jose, CA (US)

( * ) Notice: Subject to any disclaimer, the term of this patent is extended or adjusted under 35 U.S.C. 154(b) by 336 days.

(21) Appl. No.: 15/298,464

(22) Filed: Oct. 20, 2016

(65) Prior Publication Data

US 2017/0124247 A1 May 4, 2017

Related U.S. Application Data

(60) Provisional application No. 62/250,913, filed on Nov. 4, 2015.

(51) Int. Cl.
| | |
|---|---|
| *G06F 17/50* | (2006.01) |
| *G03F 1/36* | (2012.01) |
| *H01J 37/302* | (2006.01) |
| *H01J 37/317* | (2006.01) |

(52) U.S. Cl.
CPC ............ *G06F 17/5081* (2013.01); *G03F 1/36* (2013.01); *H01J 37/3026* (2013.01); *H01J 37/3174* (2013.01); *H01J 2237/31771* (2013.01); *H01J 2237/31774* (2013.01)

(58) Field of Classification Search
CPC .. H01J 37/3026; H01J 37/3174; G03F 7/2061
See application file for complete search history.

(56) References Cited

U.S. PATENT DOCUMENTS

| | | | | |
|---|---|---|---|---|
| 2002/0148978 | A1* | 10/2002 | Innes | ............... B82Y 10/00 |
| | | | | 250/492.22 |
| 2012/0217421 | A1* | 8/2012 | Fujimura | ............ G03F 1/36 |
| | | | | 250/492.3 |

OTHER PUBLICATIONS

Cui, Z. "A new analytical model for simulating resist heating in electron beam lithography". J. Phys. D: Appl. Phys. 25. pp. 919-923. (Year: 1992).*

(Continued)

*Primary Examiner* — Vuthe Siek
*Assistant Examiner* — Aric Lin
(74) *Attorney, Agent, or Firm* — MLO, a professional corp.

(57) ABSTRACT

In some embodiments, data is received defining a plurality of shot groups that will be delivered by a charged particle beam writer during an overall time period, where a first shot group will be delivered onto a first designated area at a first time period. A temperature of the first designated area at a different time period is determined. In some embodiments, the different time period is when secondary effects of exposure from a second shot group are received at the first designated area. In some embodiments, transient temperatures of a target designated area are determined at time periods when exposure from a shot group is received. An effective temperature of the target area is determined, using the transient temperatures and applying a compensation factor based on an amount of exposure received during that time period. A shot in the target shot group is modified based on the effective temperature.

17 Claims, 10 Drawing Sheets

(56) References Cited

OTHER PUBLICATIONS

Babin and Karklin, Propagation of resist heating mask error to wafer level, Proc. SPIE 6349, Photomask Technology 2006, 634950, Oct. 20, 2006, 9 pages, http://dx.doi.org/10.1117/12.690533.
Babin and Kuzmin, EBL resist heating error and its correction, Proc. Spie 6283, Photomask and Next-Generation Lithography Mask Technology XIII, May 20, 2006, 7 pages, http://dx.doi.org/10.1117/12.681752.
Nomura et al., Study on modeling of resist heating effect correction in EB mask writer EBM-9000, SPIE Proceedings, Jul. 9, 2015, vol. 9658, 6 pages.
References, aBeam Technologies, Inc., Accessed on Dec. 21, 2016, http://www.abeamtech.com/?dir=products/TEMPTATION&pg=references.

* cited by examiner

SHAPED BEAM LITHOGRAPHY INCLUDING TEMPERATURE EFFECTS

RELATED APPLICATIONS

This application claims priority to U.S. Provisional Patent Application No. 62/250,913, entitled "Method and System for Forming Patterns Using Shaped Beam Lithography Including Temperature Effects" and filed on Nov. 4, 2015, which is hereby incorporated by reference for all purposes.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask or reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45 degree right triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be fabricated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

SUMMARY OF THE DISCLOSURE

Methods of the present disclosure include receiving data defining a plurality of shot groups that will be delivered by a charged particle beam writer during an overall time period, where a first shot group in the plurality of shot groups will be delivered onto a first designated area of a surface at a first time period in the overall time period. A temperature of the first designated area at a different time period in the overall time period is determined. In some embodiments, the different time period is a second time period at which secondary effects of exposure from a second shot group are received at the first designated area. Secondary effects of exposure from the second shot group include long-range effects and/or mid-range effects, the long-range effects including backscattering, and the mid-range effects including EUV scattering effects.

In some embodiments, methods include receiving data defining a plurality of shot groups that will be delivered by a charged particle beam writer during an overall time period, where a target shot group in the plurality of shot groups will be delivered onto a target designated area of a surface at a target time period in the overall time period. A plurality of transient temperatures of the target designated area at a plurality of time periods is determined, each time period being a span of time at which an exposure from a shot group in the plurality of shot groups is received at the target designated area. At least one shot group for which a transient temperature is determined is different from the target shot group. An effective temperature of the target designated area for the overall time period is determined, by using the plurality of transient temperatures and applying a compensation factor to the transient temperature at each time period. The compensation factor is based on an amount of the exposure received by the target designated area during that time period. A shot in the target shot group is modified based on the effective temperature of the target designated area.

In some embodiments, methods include receiving data defining a plurality of shot groups that will be delivered by a charged particle beam writer during an overall time period, where a first shot group in the plurality of shot groups will be delivered onto a first designated area of a surface at a first time period in the overall time period. A temperature of the first designated area at a second time period is determined, the second time period being a time at which secondary effects of exposure from a second shot group in the plurality of shot groups are received at the first designated area. A temperature-based proximity effect correction (PEC) is performed on the first shot group, the temperature-based PEC taking into account how the temperature of the first designated area at the second time period affects the secondary effects of exposure from the second shot group at the first designated area.

Embodiments of a system include a device configured to receive data defining a plurality of shot groups, and a device configured to determine a plurality of transient temperatures. The plurality of shot groups will be delivered by a charged particle beam writer during an overall time period, where a target shot group in the plurality of shot groups will be delivered onto a target designated area of a surface at a target time period. The plurality of transient temperatures are transient temperatures of the target designated area at a plurality of time periods in the overall time period, where at least one time period in the plurality of time periods is a time period at which secondary effects of exposure from a second shot group in the plurality of shot groups are received at the target designated area.

DETAILED DESCRIPTION OF THE EMBODIMENTS

Figure 1:
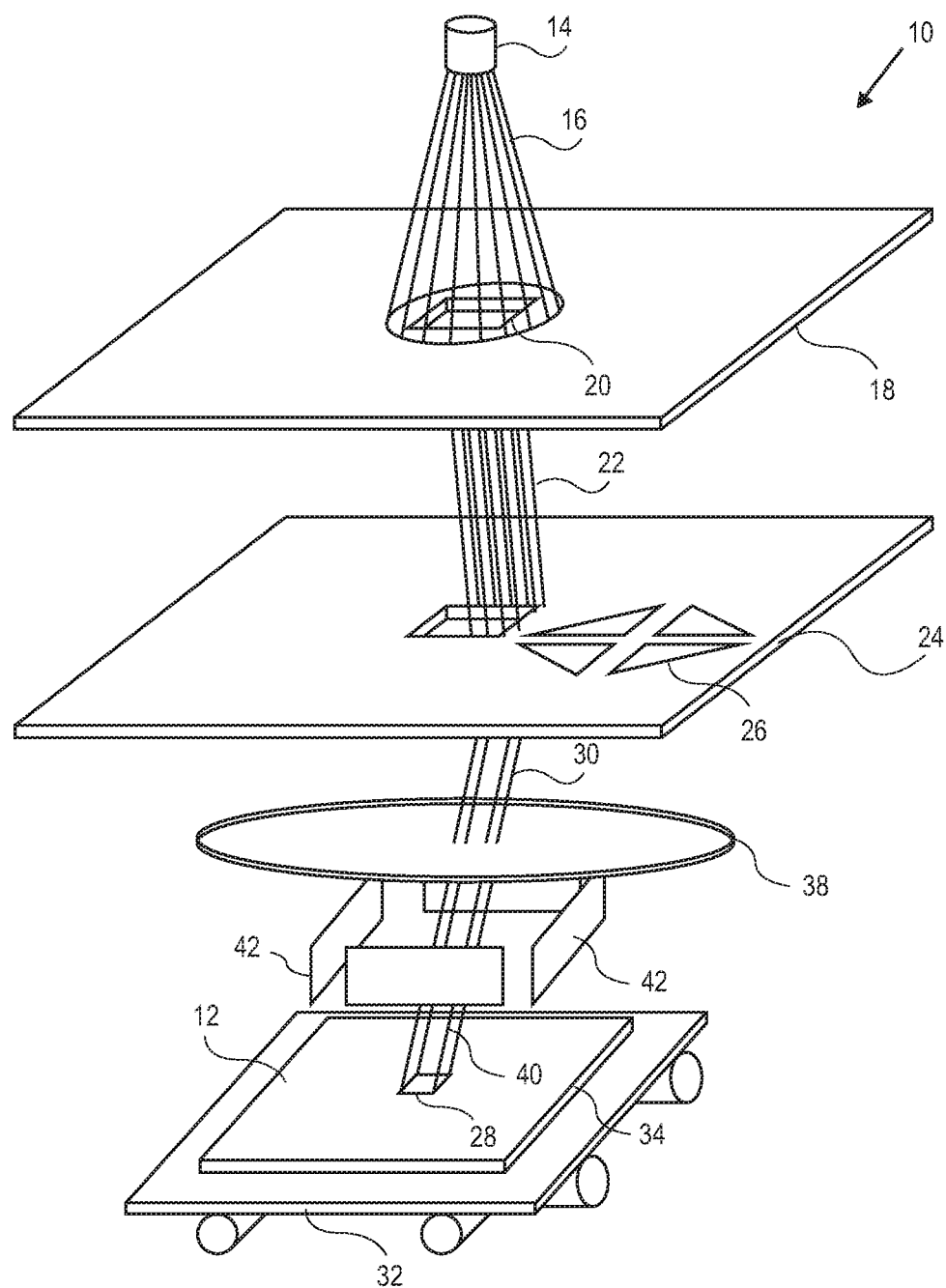
FIG. 1 illustrates an example of a variable shaped beam (VSB) charged particle beam system.

The present disclosure is related to lithography, and more particularly to the design and manufacture of a surface which may be the surface of a reticle, a wafer, or any other surface, using charged particle beam lithography. Although embodiments shall be described in terms of a semiconductor wafer or a photomask, the methods and systems described herein can also be applied to other components used in the manufacturing of semiconductor devices. The embodiments may also be applied to the manufacturing of various electronic devices such as flat panel displays, micro-electromechanical systems, and other microscopic structures that require precision by electron beam writing. Accordingly, a reference to shots being delivered onto a surface shall apply to, for example, a surface of a semiconductor wafer, or a surface of a reticle or photomask.

As the size of shapes that are to be formed on a surface such as a reticle decreases in newer fabrication technologies, higher precision resists are being used to form these patterns. The sensitivity of these higher-precision resists is lower than for resists used for larger fabrication technologies. For example, common resists may have a sensitivity of 15 uC/cm$^2$, but higher-precision resists more typically have 25-45 uC/cm$^2$ sensitivity. Even lower sensitivity resists, including some resists where sensitivity is >100 uC/cm$^2$, are already used for some specific high-accuracy applications. The higher dosage required by the lower-sensitivity resists increases reticle write times. To help reduce this increase in write time caused by the lower-sensitivity resists, newer charged particle beam writers are being developed which allow larger maximum currents. Whereas most electron beam writers currently in use support current densities in the 400-1600 A/cm$^2$ range, even higher current densities are anticipated in future generations of charged particle beam writers. In addition to stronger beam currents being used, shots are also being delivered at a more rapid rate to reduce write times. Both of these factors result in less time for heat to dissipate in the surface that is being exposed and the underlying substrate.

The charged particles from a charged particle beam shot heat up the resist and the substrate on which the resist is coated. Higher-current charged particle beam writers can provide a given shot dosage to a substrate such as a reticle in a shorter period of time than lower-current charged particle beam writers, thereby causing a higher temperature increase on the resist and the substrate upon which the resist is coated. Since various manufacturing conditions such as a resist's threshold, that is the dosage at which the resist will register a pattern, are temperature dependent, the larger temperature increase will increase the observed critical dimension (CD) variation of a pattern formed using a higher-current charged particle beam writer, compared to use of a lower-current charged particle beam writer. Similarly, any charged particle beam exposure writer or method which increases the temperature range or thermal variation of the substrate during the writing process, will increase the CD variation observed in the pattern formed on the substrate.

In this disclosure, patterns being written on the surface of a mask, wafer or other substrate are modeled using techniques to account for temperature-related impacts of indirect effects of electron beam exposures—also called secondary effects—in addition to direct exposure effects, and to account for temperature-related impacts on such indirect effects. Effects on temperature from secondary effects from charged particle beam shots, and/or effects of temperature on secondary effects are simulated and, in some embodiments, corrected so that patterns can be more accurately formed to desired specifications. Indirect, or secondary, effects can include long-range effects such as backscattering, and mid-range effects such as for writing EUV masks.

When a charged particle beam exposes a surface, there are various physical effects that impact the accuracy of the pattern being written on the surface. These effects are typically described as short-range, mid-range and long-range effects. Short-range effects include forward scattering, Coulomb effect, and resist diffusion. Mid-range effects occur most notably when writing masks for extreme ultraviolet (EUV) optical lithography, in which mid-range scattering of charged particles such as electrons may affect a radius of 1 to 2 μm. Long-range effects include backscatter, fogging, and loading effects. Backscattering results from the collision of the incident electrons with the substrate, where the charged particles are scattered.

These various physical effects can affect the surface that is being written, due both to electron-based exposure of the surface, and to heat created by application of the electron beam. The impact of the differences in temperature at the time of receiving these secondary effects, such as mid-range and long-range effects, including backscattering, has not been recognized in the art. For example, while exposure sensitivity of a mask or wafer surface is known to be dependent on both temperature and exposure, neither the effect of the temperature of the area at the time of receiving indirect exposure nor the effect of indirect exposure on the temperature distribution has been accounted for in the art. The recognition of the presence of these effects gives rise to the methods of the present disclosure where more accurate analysis, simulation, and correction for these secondary effects, for example, EUV mid-range correction and proximity effect correction (PEC), are described that take effects of temperature into account. Specifically, the effect of the temperature of the area at the time of receiving secondary effects, which has not been accounted for in the art, are simulated, which may involve various degrees of approximations or direct computations in order to gain computational efficiency such as in run-time or in required memory, and the results used to produce more accurate patterns for electron beam writing.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. Conventionally, the blanking period may be a fixed length of time, or it may vary depending, for example, on how much the deflector 42 must be re-adjusted for the position of the succeeding shot.

In electron beam writer system 10, the substrate 34 is mounted on a movable platform or stage 32. The stage 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce CD variation due to thermal effects. Multi-pass writing also averages out random errors of the charged particle beam writer. Multi-pass writing using different shot lists for different exposure passes can also reduce the effects of certain systemic errors in the writing process.

Figure 2:
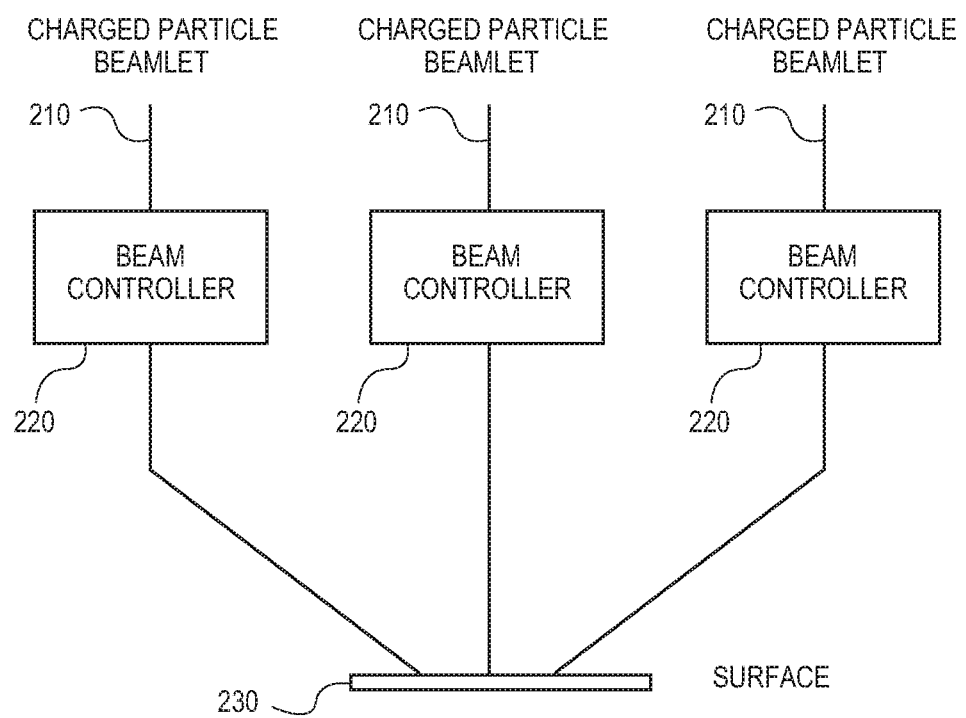
FIG. 2 illustrates an example of an electro-optical schematic diagram of a multi-beam exposure system.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230. In some embodiments each beamlet may have a separate electro-optical lens, while in other embodiments a plurality of beamlets, including possibly all beamlets, will share an electro-optical lens.

Figure 3A:
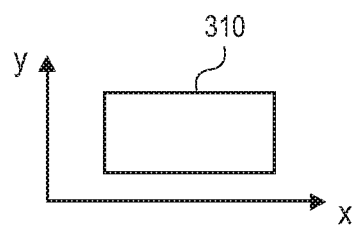
FIG. 3A illustrates an example of a rectangular shot.
Figure 3B:
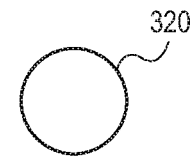
FIG. 3B illustrates an example of a circular character projection shot.
Figure 3C:
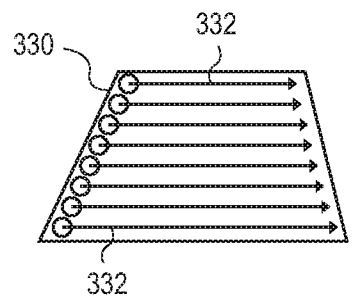
FIG. 3C illustrates an example of a trapezoidal shot.
Figure 3D:
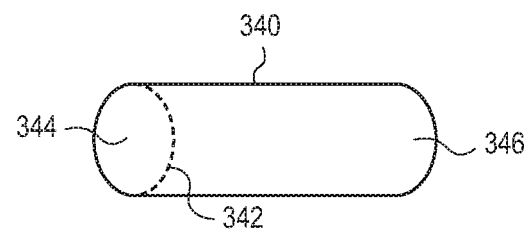
FIG. 3D illustrates an example of a dragged shot.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIG. 3 illustrates some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be a created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-0089345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

Figure 3E:
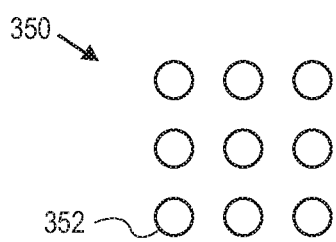
FIG. 3E illustrates an example of a shot which is an array of circular patterns.
Figure 3F:
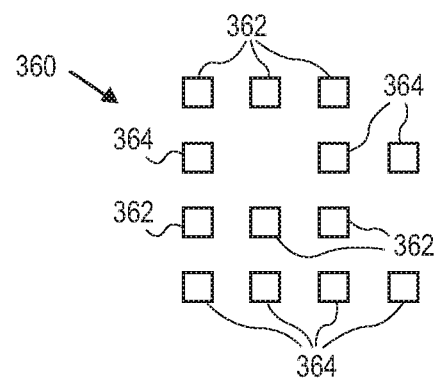
FIG. 3F illustrates an example of a shot which is a sparse array of rectangular patterns.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
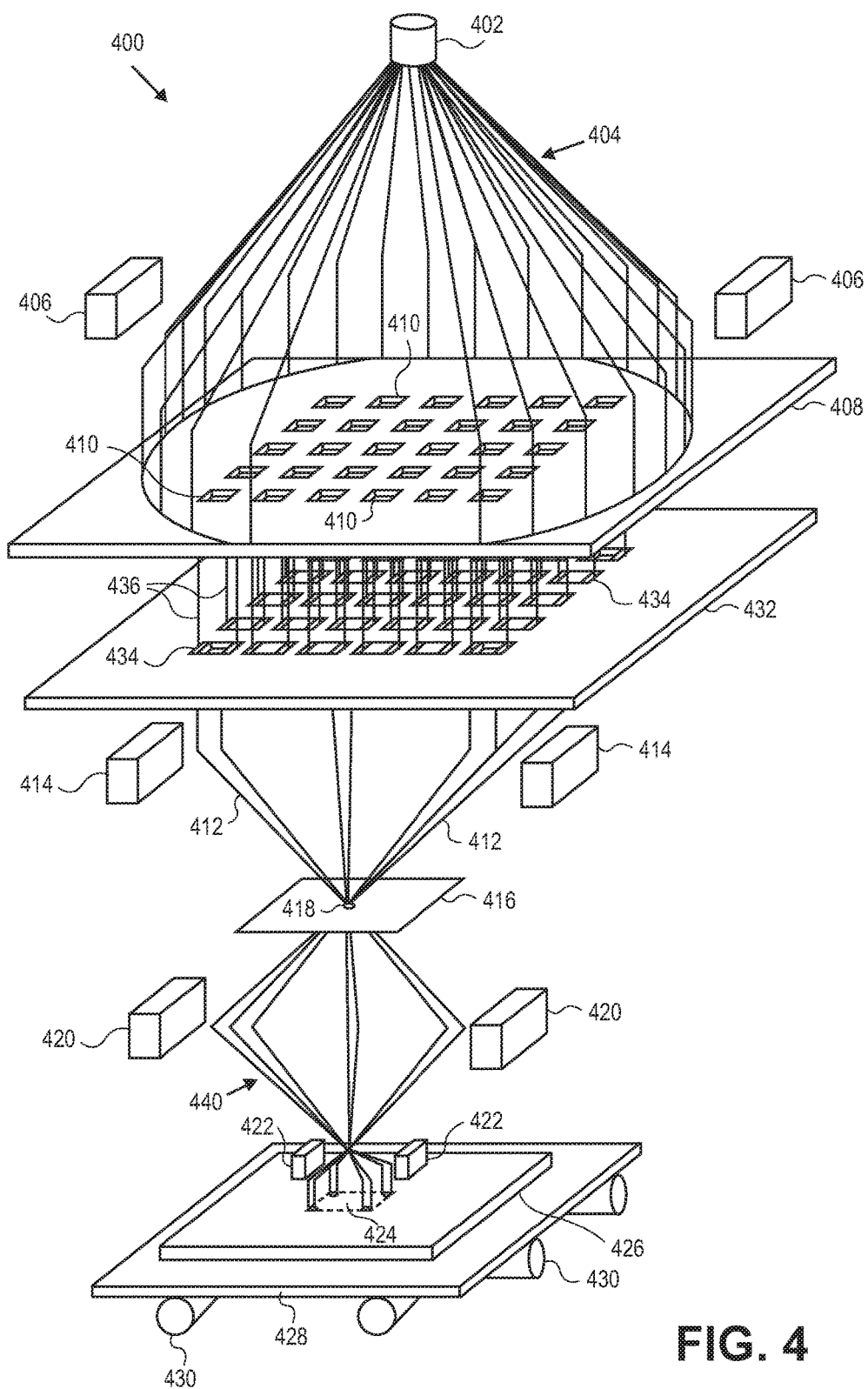
FIG. 4 illustrates an example of a multi-beam charged particle beam system.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be rectangular, or may be of a different shape, for example circular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled.

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that corresponds to the pattern of the apertures 410, which are allowed to strike surface 424 by blanking controllers 434. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group.

Other types of multi-beam systems may create a plurality of unshaped beamlets 436, such as by using a plurality of charged particle beam sources to create an array of Gaussian beamlets.

In this disclosure, reference to a charged particle beam system shall apply to either a single-beam writer system as in FIG. 1 or multi-beam writer system as in FIG. 4. Accordingly, an individual shot from an electron beam writer in this disclosure shall refer to exposure by a beam produced by the system 100 of FIG. 1, or by a group of beamlets produced by the system 400 of FIG. 4, or by a beamlet produced by the system 400 of FIG. 4. In addition, one or multiple occurrences of the shots from FIGS. 3A-3F or FIG. 4, that are delivered onto a designated area in a certain time period shall be referred to as a shot group. For example, if various shots are delivered onto a designated area at a certain designated time, such as in writing all shots of a sub-zone, the shots may be referred to collectively as a shot group. The designated time is the time period during which the shots of that shot group are delivered. Shot groups may be a grouping of shots delivered onto an area of any chosen size and over a chosen time, as desired for computational efficiencies and for a desired computational resolution for that area or that span of time. Thus, shot groupings may be chosen according to time and space adjacencies for a specific situation. Furthermore, shot groups may be grouped by areas of the same size or of varying size across the surface that is being analyzed. The shots or shot groups for an entire surface that is being written, such as a mask, are delivered over an overall time period, where each shot or shot group is delivered at a time period within the overall time period. In exposing a surface, there may be a plurality of shot groups, the designated areas of which may or may not overlap with each other, and the designated times of which may or may not overlap each other.

Referring again for FIG. 1, the minimum size pattern that can be projected with reasonable accuracy onto a surface 12 is limited by a variety of short-range physical effects associated with the electron beam writer system 10 and with the surface 12, which normally comprises a resist coating on the substrate 34. These effects include forward scattering, Coulomb effect, and resist diffusion.

The shot dosage of a charged particle beam writer such as an electron beam writer system is a function of the intensity of the beam source 14 and the exposure time for each shot. Typically the beam intensity remains fixed, and the exposure time is varied to obtain variable shot dosages. Different areas in a shot may have different exposure times, such as in a multi-beam shot. The exposure time may be varied to compensate for various long-range effects such as backscatter, fogging, and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels.

Conventionally, shots are designed so as to completely cover an input pattern with rectangular shots, while avoiding shot overlap wherever possible within an exposure pass. Also, all shots are designed to have a normal dosage, which is a dosage at which a relatively large rectangular shot, in the absence of long-range effects, will produce a pattern on the surface which is the same size as is the shot size. Some electron beam writer systems enforce this methodology by not allowing shots to overlap within an exposure pass.

Each shot heats up both the resist and the underlying materials such as chrome, quartz, silicon, or molybdenum upon which the resist is coated. The interaction of the energy cast on the resist and the underlying materials causes heating. The interaction starts with the scattering of the electrons within a pico-second range of the shot, including forward scatter and secondary effects. But because the dominant part of the behavior of the heat distribution of the mask from a shot happens over an order of milliseconds, the temperature effect may or may not be modeled independently of the pico-second effect of how the electrons scatter. The heating effect from forward electron-based exposure is known in the art; however, modeling of the temperature effect on or from secondary effects is not known in the art.

The resist in the vicinity of a shot heats up quickly during a shot, but also cools quickly during the blanking period following the shot. The cooling during the blanking period does not return the local temperature to the previous state, however. In a typical shooting sequence, because an electron beam writer needs to write the surface as fast as possible to be commercially viable, heat from multiple shots in sequence will accumulate despite the blanking time in between. Since factors such as different shot sizes, different shot dosages, and different blanking times, as well as the geometric sequencing and distances of the various shot sequences all affect the temperature profile of the mask over the write time of the mask, the temperature profile of the mask varies significantly over space and time. The area on which the electron beam is delivered is heated on the order of picoseconds by direct exposure from the shot, and the heat then spreads and dissipates on the order of milliseconds. How the heat spreads and dissipates is governed by the laws of thermodynamics and depends on various factors such as thermal conductivity, heat capacity and density of the resist and of the underlying materials, as well as surrounding conditions that affect temperature. Because of the materials used, in typical applications of electron beam writing, the surface and the underlying materials have a significant change in temperature in space and time that is affected by a shot in a millisecond order of time after the shot. In practice, heating of the underlying materials is a bigger issue than resist heating if an immediate neighborhood both in space and time contains a high density of shots. Heating of underlying materials from previous shots will affect the resist temperature at the start of a shot. Since the resist threshold is temperature dependent, changes in the resist temperature at the start of a shot will affect the CD of the developed pattern on the surface of the substrate. Prior art results show that the CD can change by 4 nm or more due to thermal effects. This amount of thermally-induced CD variation is often considered unacceptably high, given that a total permissible CD variation from all sources combined may be, for example, 1-2 nm.

Figure 5:
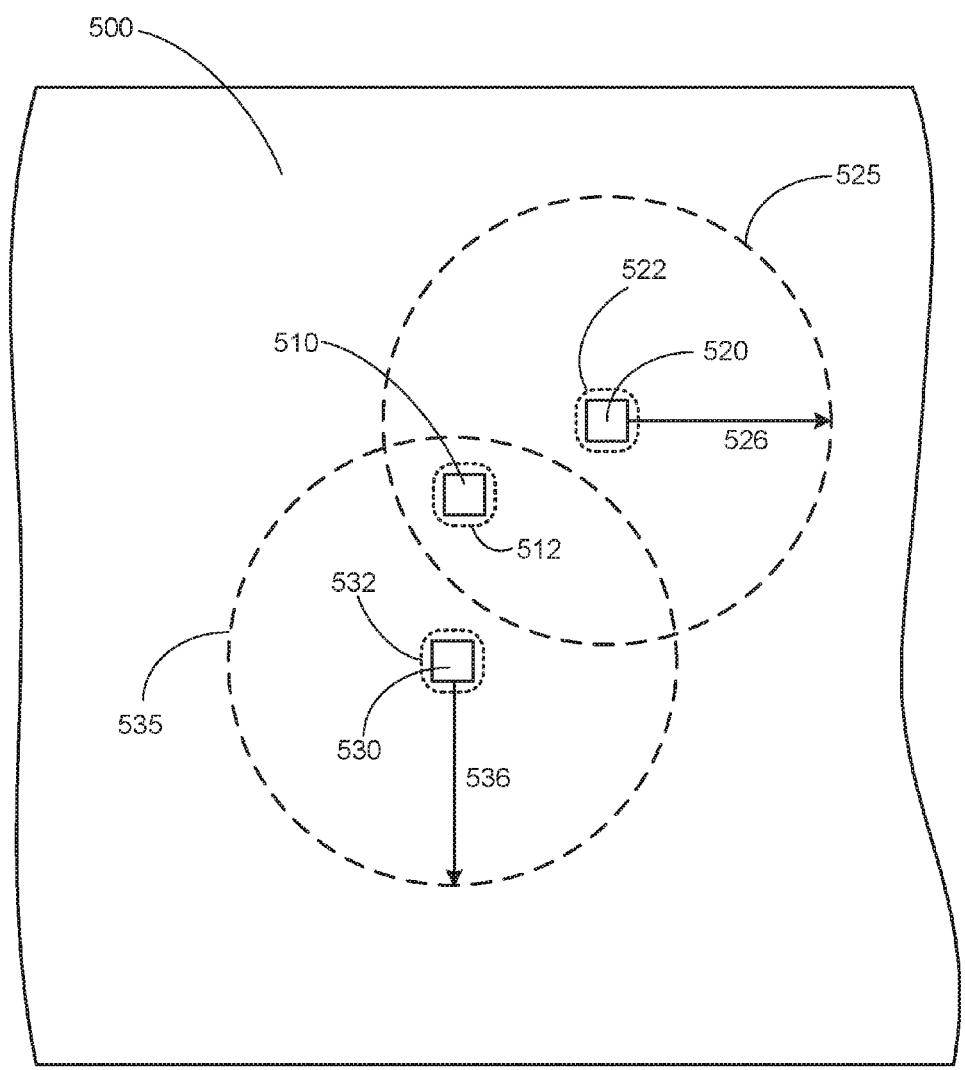
FIG. 5 illustrates exposure-related ranges of forward scattering and backscattering.

FIG. 5 illustrates the impact of forward scattering and backscattering on the amount of exposure at a given location. For the surface 500 of FIG. 5, shot 510 is the area under consideration, while shots 520 and 530 are neighboring shots. Surface 500 is the surface of a substrate, such as a semiconductor wafer or a reticle that will be used to form a semiconductor wafer. Note that shots 510, 520 and 530 are shown as squares in this example, although other shapes are possible. The shots 510, 520 and 530 have square outlines in this embodiment, indicating the beam size. Forward scattering areas 512, 522 and 532, due to the incident electrons being deflected slightly as they move forward into the resist, result in additional exposure of a short-range surrounding area indicated by dotted lines. For example, for a 200 nm sized square, the one-sigma forward scattering range (i.e., 68% of the distribution) will be approximately 15-40 nm. Backscattering is another physical effect that occurs as electrons reflect back in the direction of the beam, thus having a longer-range effect as indicated by dashed lines 525 and 535. For example, for a 200 nm sized square, the one-sigma backscattering range is 10 μm as shown by arrows 526 and 536 for shots 520 and 530, respectively. Note that for clarity, the distances in FIG. 5 are not drawn to scale. Also, the backscattering range for shot 510 is not shown in the figure, since the exposed area caused by shot 510 is the area under consideration.

Thus, it is clear from FIG. 5 that far more shots cast backscattering on a given pattern than the number of shots casting forward scatter on that pattern. In FIG. 5, for example, the pattern being formed by shot 510 will not only be formed by the electron exposure delivered by shot 510 and its forward scattering 512, but also will be impacted by electron exposure due to the backscattering from shots 520 and 530. This is because the backscattering areas 525 and 535 overlap shot 510, imparting energy to the shot area 510. Furthermore, in addition to the electron exposures of the location of shot 510, the effect of exposure at the location of shot 510 will be affected by the temperature there at the time at which shots 510, 520 and 530 are delivered (as well as any other shots that may be within the backscatter range of 512). In some embodiments of the present disclosure, these heat-based effects are modeled as affecting the dosage required to form the desired pattern. The heat-based effects include slow heating from heat diffusion, fast heating from direct application of the electron beam, and fast heating from secondary effects, where slow heating is on the order of milliseconds due to heat diffusion, and fast heating is on the order of picoseconds due to the electron beam being applied. In some embodiments, the effects of temperature on secondary effects is modeled and corrected for. In other embodiments, the heat effects and exposure effects are modeled together. In some embodiments, an effective temperature at the location at which the pattern will be formed is determined, where the effective temperature is based on the temperatures of the first designated area at a plurality of time periods, and where exposure is received by the first designated area at each of the time periods. In certain embodiments, the temperature effect on forming the desired pattern may be modeled as a temperature-dependent resist threshold, where the effective temperature can be used to determine a change in the resist threshold and thus the dosage required to write the pattern being formed.

Electron exposure of the resist due to forward scattering and secondary effects occurs in surrounding areas when the electron beam is active. Modeling of and accounting for these exposure effects are known in the art—combined blur to incorporate forward scattering; proximity effect correction for backscattering; and proximity effect correction for mid-range, such as for EUV masks by either extending the forward scattering radius, or by proximity effect correction, or a combination of both. However, the impact of heat on or from secondary effects such as backscattering or mid-range scattering has not been recognized. As electron beam-based writing techniques have changed over the years, such as by using higher-precision/lower-sensitivity resists, higher density beam currents, and more rapid shot writing, new issues have arisen regarding how shots interact with each other. Heat in the substrate will linger even after the beam is turned off, and thus secondary effects are dependent on temperature changes that occur during the time period that the shots causing the secondary effects are delivered. In the present disclosure, this discovery of time and space impacts of secondary effects on temperature, and therefore on the pattern that is formed at a given location, allows for modeling and corrections that can improve the formation of patterns used in electronic devices. In some embodiments, temperatures are determined, using exact calculations or approximations, each time that a shot group that is within a secondary effect range of the target area under consideration is delivered. Those temperatures are combined into an effective temperature. Simulation of the impact of temperature on secondary effects, and use of the simulations for modifying shots to form more accurate patterns, are described in more detail herein.

Figure 6:
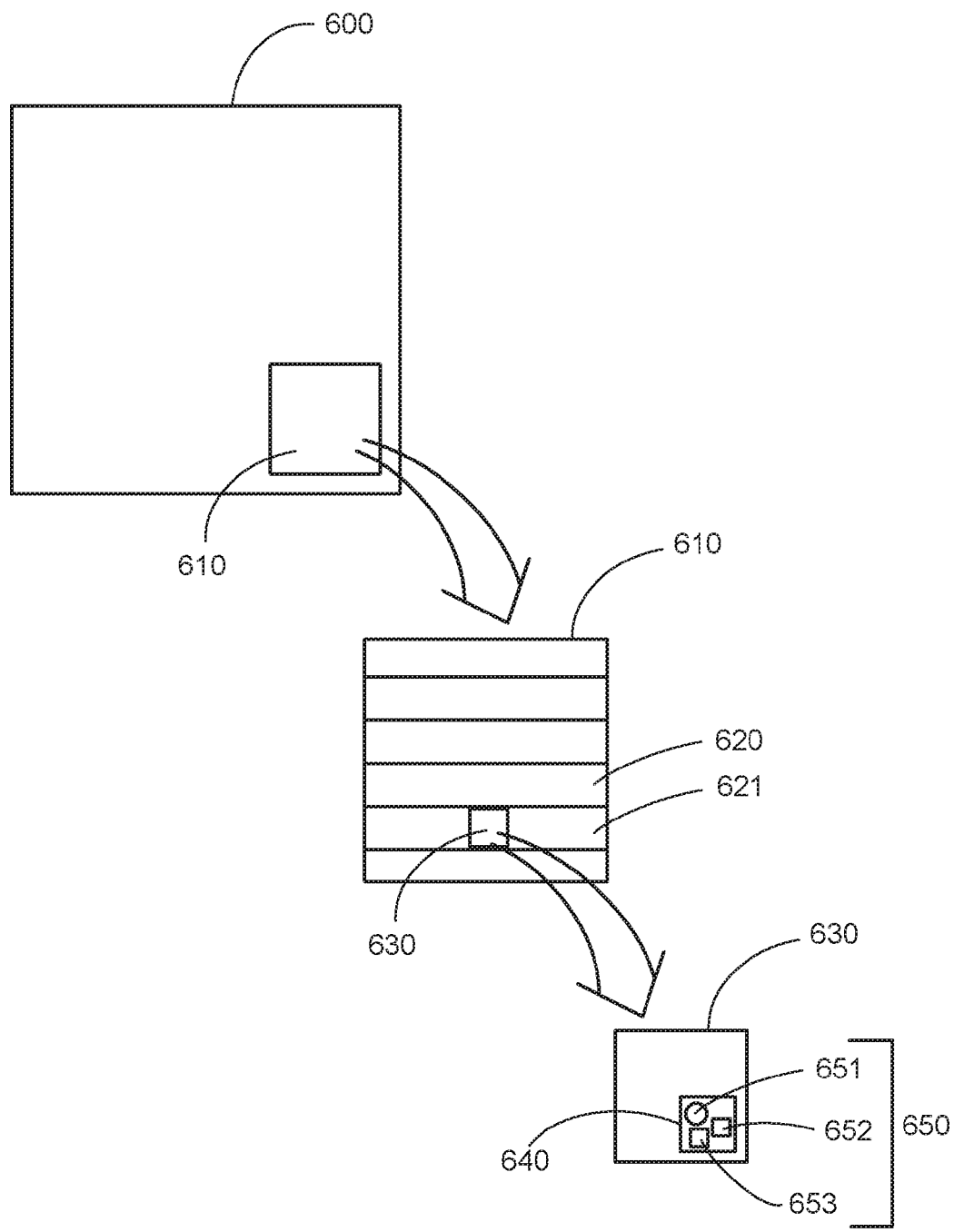
FIG. 6 illustrates various size scales that may be used for analysis in various embodiments.

In various embodiments, modeling of temperature-related effects from or on secondary effects can be performed at various scales depending on the level of detail desired to balance computational requirements and precision. FIG. 6 shows exemplary levels that can be used as designated areas for which analysis can occur. A substrate 600, which can be a mask or reticle for manufacturing a semiconductor wafer, or could be a wafer itself, has a chip 610. The chip 610 is typically written using stripes, such as stripes 620 and 621, where the stripes 620 and 621 are made of zones 630. Zone 630 may be, for example, a subfield, or may be a different size smaller than a stripe. For example, a stripe may have a height of approximately 100 µm, and a zone would be an area smaller than the stripe. Zones 630 may have further sub-zones 640 in which shot group 650 is written, where the sub-zones 640 may be any designated area of a size smaller than zone 630. Additionally, sub-zones 640 may be divided into even smaller scales of sub-zones, where the smaller sub-zones can also be used for purposes of analysis. There may be a hierarchy of sub-zones. For example, a zone may have a size of 50-500 µm in one-dimension and 1-20,000 µm in the other dimension, with the dimension being chosen for computational convenience. For another example, a sub-zone may have a size of 64 µm×64 µm.

In sub-zone 640 of FIG. 6, the shot group 650 includes three individual shots 651, 652 and 653. Note that the shots 651, 652 and 653, for the purposes of this disclosure, can include shots made by a single beam, a multi-beam exposure of multiple simultaneous beamlets, or a beamlet of a multi-beam charged particle beam writer. In some embodiments, shot group 650 may include only one individual shot, such as shot 651, 652 or 653. In other embodiments, a zone 630 or sub-zone 640, or other size of designated area and designated time period being analyzed, may include thousands or tens of thousands, or even much greater number of individual shots or shot groups.

In some embodiments, simulation methods may adjust the sizes of the designated area or the designated time period associated with the shot group dynamically. In such embodiments, the simulation methods may be performed at a coarser or finer scale at different locations on the surface in order to achieve a particular level of accuracy. For example, when trying to calculate temperature values for shot 651, shots 652 and 653 may be treated independently. However, when trying to calculate temperature values for a location within stripe 620, interactions with shots 651, 652, and 653 may all be treated as a single interaction—that is, shot group—with sub-zone 640, or even with all of zone 630 at once. An individual shot may be treated as parts of different scales, depending upon what it is interacting with. Shots and shot groups may be modeled as an aggregate effect at larger time intervals such as in microsecond or millisecond intervals, instead of the more detailed pico-second intervals. Some embodiments take a weighted average in space and time of all shots of a shot group. Computation proceeds as though one larger and longer shot occurs at a location and at a point in time. This reduces the number of computed elements, reducing run-time at the expense of accuracy.

Figure 7:
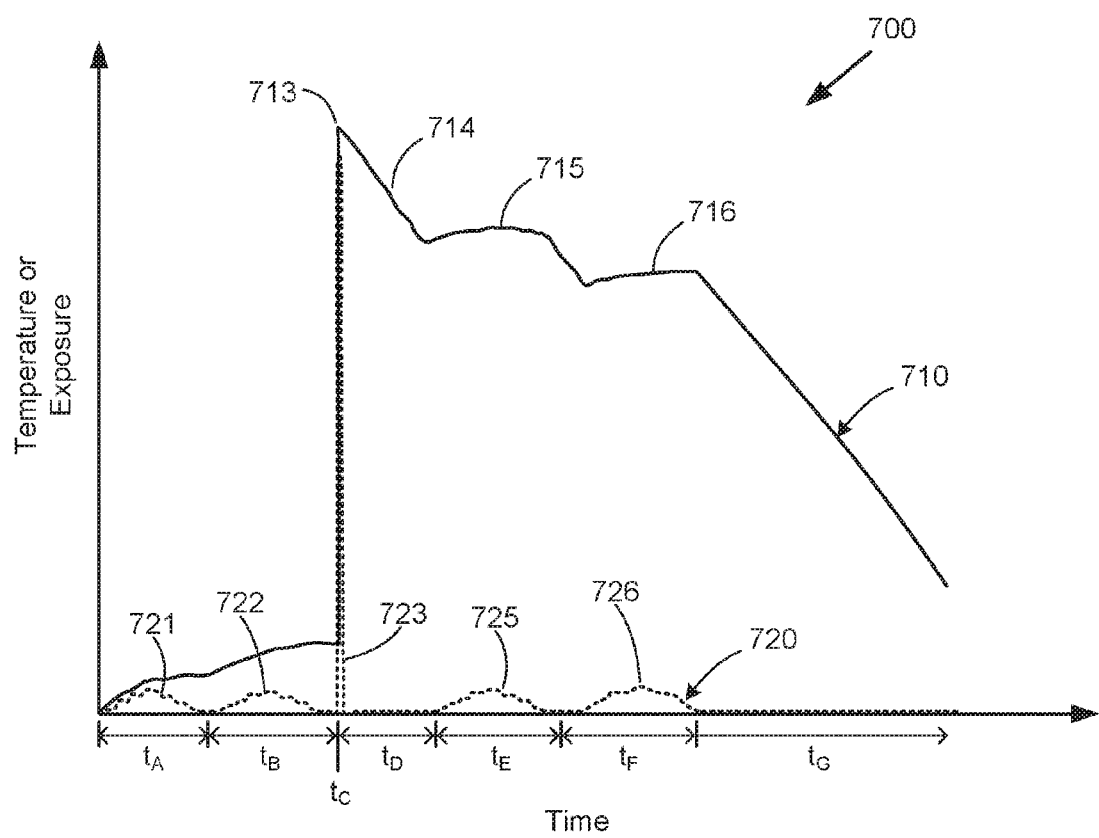
FIG. 7 illustrates a transient temperature graph for an exemplary area of a surface.

FIG. 7 is a graph 700 representing transient temperature and exposure curves for an exemplary target designated area at which a target shot will be delivered. The drawings in time and magnitude are not to scale and are for illustrative purposes only. Although FIG. 7 will be described for an individual shot, the concept also applies to a shot group for a designated area as explained above in relation to FIG. 6. The y-axis of FIG. 7 represents temperature and exposure, with temperature curve 710 being represented with a solid line and exposure curve 720 being represented by a dotted line. In this example, during time periods $t_A$ and $t_B$, the surface of the target area is exposed to electrons due to backscattering or other secondary effects from neighboring shots. The exposure curve 720 illustrates the exposure from these secondary effects with two small peaks 721 and 722 in this example, which could be, for example, the result of two sets of multiple surrounding shots occurring over the periods $t_A$ and $t_B$, respectively. Peaks 721, 722, 725 and 726 are depicted as smooth curves at a zoomed out scale, but in detail, in a typical electron beam writer, the surrounding shots that emit secondary effects come from individual shots with resting or settling time in between. An aggregated approximation of the effect of a shot group in an embodiment may be closer to a smooth curve as depicted by these peaks. A temperature of the target area changes how the secondary effects affect the exposure of the target area. For example, a higher temperature of the target area at a given time causes the secondary effects received at the target area at that time to have more impact. Each occurrence of a secondary effect is minimal, but the sum of all secondary effects is significant. Thus, if a particular target area received a significant portion of its secondary effects at high temperatures, the shapes written in that area will be larger, resulting in an increase in critical dimensions. The secondary effects may also cause the temperature of the target area to rise slightly due to electron exposures from the surrounding shots.

At time $t_C$, the target shot at the target area occurs. Time $t_C$ may be referred to as the designated time period of the target shot. This target shot is shown as a spike 723 in the exposure curve 720, which causes a sudden temperature increase 713 in the temperature curve 710. After the electron beam for the target shot is turned off, the surface begins to cool during time period $t_D$ as shown by the downward slope of temperature segment 714. During time $t_D$ in this example, no nearby shots have any exposures that affect the target area, and thus the exposure curve 720 is zero during $t_D$. During the subsequent time periods $t_E$ and $t_F$, secondary effects of neighboring shots occur as represented by exposure peaks 725 and 726, respectively. The exposures 725 and 726 due to secondary effects from neighboring shots are affected by the temperature of the target area at the time at which the secondary effects are received. Slight temperature increases 715 and 716 may occur due to exposures 725 and 726, with a decrease in temperature between 715 and 716 during the absence of additional exposure between exposure peaks 725 and 726. During the subsequent time period $t_G$ there are no more secondary effects from nearby shots, and consequently the temperature curve 710 steadily decreases.

Thus, FIG. 7 shows that for a given location on which a shot or shot group will be delivered, the temperature varies over time as a) the location is exposed to electrons, whether from direct exposure of the area or secondary exposure from other shots at other areas; b) as heat diffuses from the target shot at the given area, and c) as heat is infused due to direct or indirect application (e.g., mid-range effects and backscattering) of the electron beam. In the present methods, the temperature of a certain area is determined at different times in the overall time period of the writing of the surface. In some embodiments, a first shot group in the plurality of shot groups is delivered onto a first designated area of a surface at a first time period, and a temperature of the first designated area is determined at a different time period in the overall time period. A time period is the time span in which the shot or shots of a shot group is delivered. The plurality of shot groups can include a second shot group that will be delivered at a second designated area, where the different time period may be a "second time period" at which secondary effects of exposure from the second shot group are received at the first designated area. In some embodiments, the time periods at which the temperature of the first designated area are determined correspond to first time periods and second time periods, collectively for shot groups that are close enough in vicinity to receive meaningful exposure, where first time periods are when forward scattering is received and second time periods are when secondary effects of exposure are received. By determining the temperature at a second time period different from the first time period, the temperature at the second time period can be used to determine how the secondary effects of exposure due to the second shot group will contribute to exposing the first designated area.

Additionally, the transient temperatures that are determined can be used to calculate an effective temperature of a designated area for the overall time period based on the temperatures of the designated area at each time period. The designated area under analysis may be referred to as a target designated area. In some embodiments, a compensation factor is applied to the temperature of the target designated area at each time period when exposure is received at the target designated area. The compensation factor at each time period is based on an amount of exposure received by the target designated area during that time period. The compensation factor may be additionally dependent on the exposure type, where the exposure received by the designated area at each time period is an exposure type comprising forward scatter and/or secondary effects, the secondary effects including backscatter. The compensation factor may serve as, for example, a weighting factor. The effective temperature in general terms may be expressed in some embodiments as $$T\text{effective}=\int_{t=0}^{N}T(t)\cdot\text{Exposure}(t)/\int_{t=0}^{N}\text{Exposure}(t) \quad (\text{Eq. 1})$$

where the integrals are performed over the overall time period $t_N$ of writing the surface. Thus in FIG. 7, the temperature 713 at time $t_C$ would have a compensation factor "Exposure(t)" (per equation 1) applied to it based on the exposure amount of spike 723. A temperature 715 in the time interval $t_E$ would have a compensation factor "Exposure(t)" based on the amount of exposure 725 corresponding to that time point. Application of the compensation factor may involve, for example, multiplying the temperature by the quantity of exposure received at that time period, or may involve a higher order operation based on the amount of exposure. The integration of equation 1 sums the exposure-based temperatures and divides that sum by the sum of all exposures over the entire time period, thus resulting in an effective temperature of the target area for the overall time period.

Figure 8:
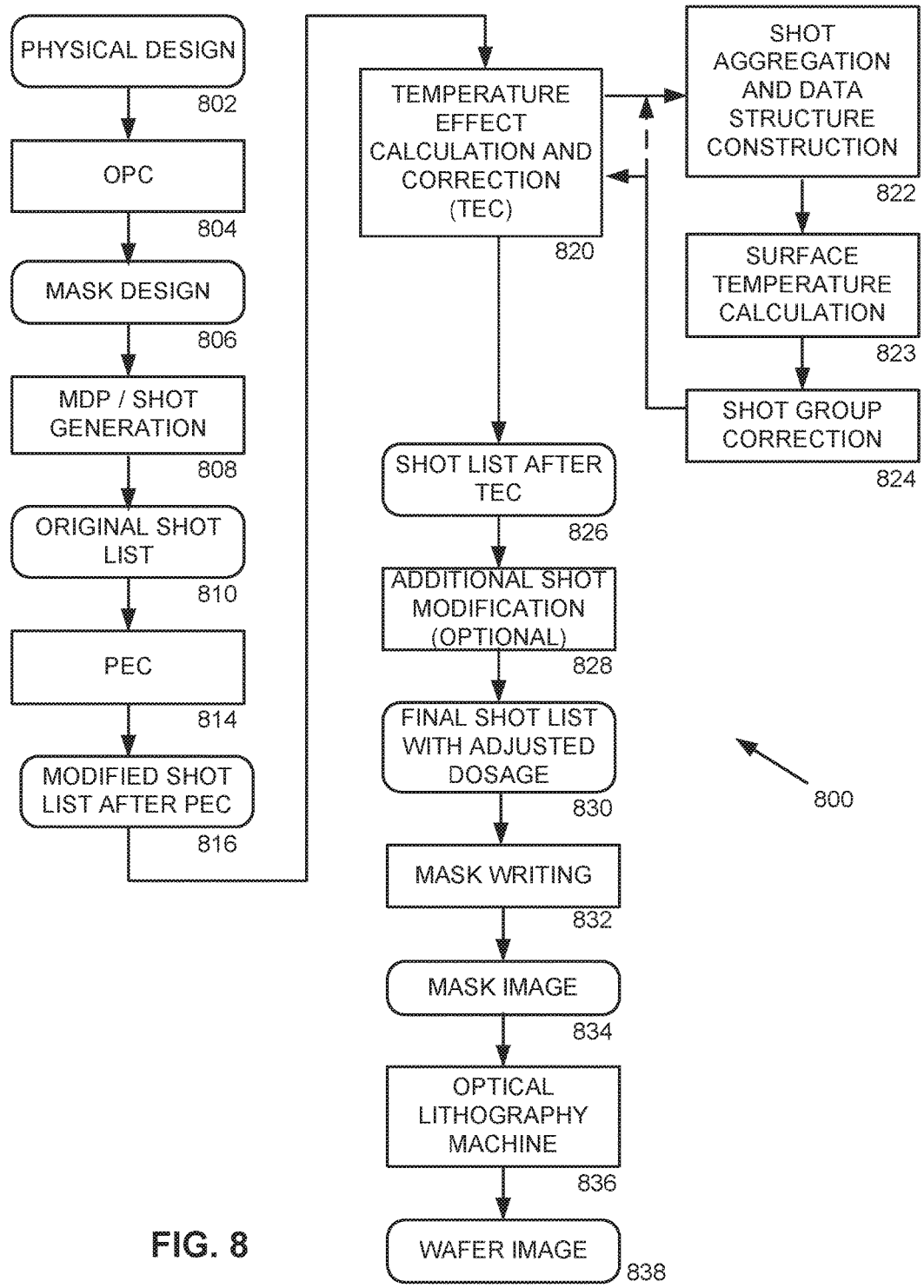
FIG. 8 illustrates a conceptual flow diagram of a method of simulating thermal-based secondary exposure effects, in some embodiments.

FIG. 8 illustrates an exemplary flowchart 800 for methods of determining temperatures of a certain area of a surface at various times during electron beam writing of the surface, and incorporating the impacts of temperature on secondary effects into simulation of charged particle beam shots. In a first step 802, a physical design, such as a physical design of an integrated circuit, is created. This can include determining the logic gates, transistors, metal layers, and other items that are required to be found in a physical design such as the physical design of an integrated circuit. Next, in a step 804, optical proximity correction (OPC) is done on the patterns in the physical design 802 or on a portion of the patterns in the physical design to create a mask design 806. OPC alters the physical design to compensate for distortions caused by effects such as optical diffraction and the optical interaction of proximate features. In MDP step 808, the mask design 806 is fractured into an original set of charged particle beam shots 810. In some embodiments the shots in shot list 810 will be VSB shots. In other embodiments the shots in shot list 810 will be CP shots or a combination of VSB and CP shots. In other embodiments the shots in shot list 810 may be multi-beam shots, or a combination of multi-beam and other shaped beam shots. Original shot list 810 may comprise shots for a single exposure pass, or for multiple exposure passes. Original shot list 810 may be an ordered set of shots comprising writing order.

PEC 814 inputs the original shot list 810. In PEC step 814, the original shot list 810 is adjusted to account for backscattering and other secondary effects, without considering temperature. Such changes could include changing the dose or size of shots based on other shot groups in the plurality of shot groups, where the other shot groups are in close or moderate proximity to the target area such that the target area is in a secondary effect range of the other shot groups. PEC 814 outputs a modified shot list after PEC 816.

The modified shot list 816 is read by a temperature effect calculation and correction (TEC) step 820. The modified shot list 816 may be considered a plurality of shot groups that will be analyzed in TEC step 820. In step 820, a system having a computing hardware processor receives data defining the plurality of shot groups that will be delivered by a charged particle beam writer over an overall time period. The shot data include dosages, times, shapes, and positions of the shots making up the shot groups. Each shot group has a designated time period within the overall time period. Each shot group will be delivered onto a designated area of a surface at a designated time period during manufacturing of the surface. In this disclosure, the shot groups may be referred to as, for example, a first shot group being delivered onto a first designated area at a first time period, or as a target shot group being delivered onto a target designated area at a target time period. Each shot group may include one or more individual charged particle beam shots.

TEC step 820 may include sub-steps of: shot aggregation and data structure construction 822, surface temperature calculation 823, and shot group correction 824. Shot aggregation and data structure construction step 822 may include establishing the size scales on which to perform analysis—such as chips, stripes, zones and/or sub-zones—depending on the desired level of detail as described in relation to FIG. 6 and to optimize computational run-time. The surface is divided into designated areas, where in some embodiments the sum of all such designated areas may tessellate the entire surface of the mask or wafer. The designated area may be assigned differently at different times, depending on the calculations being performed at that time. In some embodiments, the designated areas may be different in size from each other. In various embodiments, there may be gaps in between some areas, and/or other areas may overlap. The overlap may be for the purpose of having a certain "halo" region into which the effects of neighboring shots or shot groups can be calculated to affect a correction on the shot groups contained inside the designated areas. The halo effects provide context for the calculations of the designated area, where the shots in the halo region may not be part of shots of the designated area for final shot list 830.

Figure 9A:
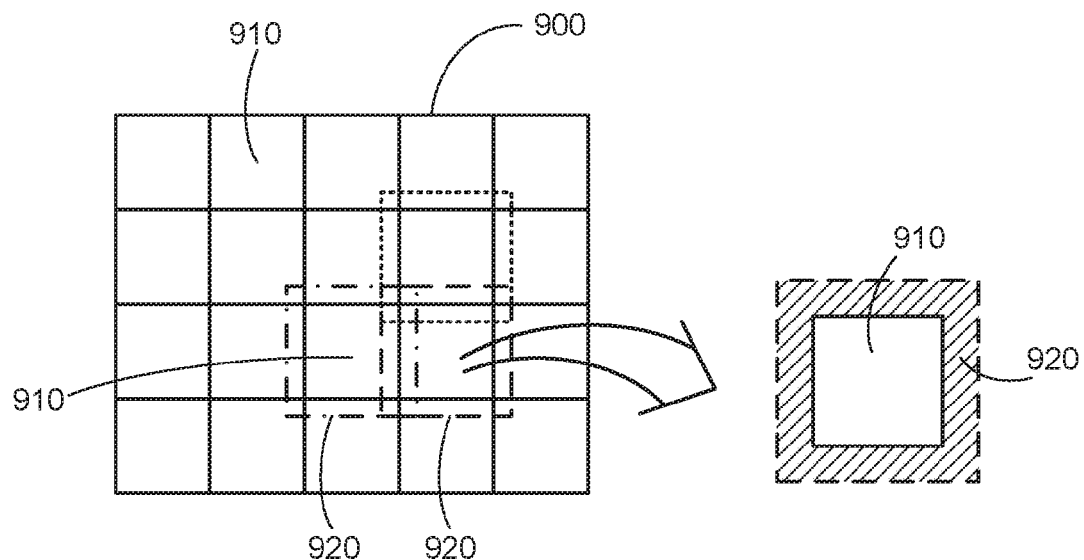
FIGS. 9A-9C illustrate the concept of halo regions.
Figure 9B:
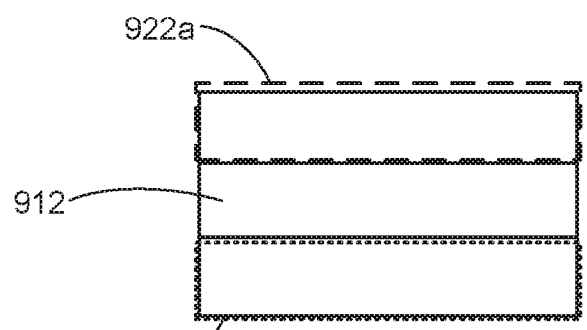
Figure 9C:
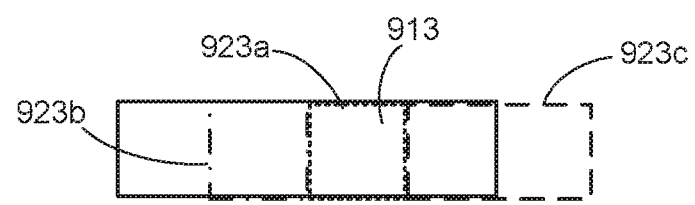

Exemplary halo regions are illustrated in FIGS. 9A-9C. FIG. 9A illustrates a surface 900 having designated areas 910, where a temperature effect calculation is to be determined for at least one of the designated areas 910. Designated area 910 is an area in which a shot group of one or more individual shots will be delivered. Halo region 920 is a region surrounding the designated area 910. Halo region 920 is adjacent to designated area 910, and shot groups in halo region 920 affect how the shot groups in designated area 910 should be corrected. But the shot groups in halo region 920 are corrected when processing other shot groups in surface 900, but outside 910. In the embodiment of FIG. 9A, the halo region 920 is an annular region around the perimeter of the approximately square designated area 910. The various halo regions 920 of surface 900 overlap. In another embodiment illustrated by FIG. 9B, the designated area 912 is a stripe, and the stripes 922*a* and 922*b* above and below stripe 912, respectively, may be utilized as the halo region for stripe 912. In other words, an entire stripe, such as stripe 922*a* and 922*b*, can be used as a halo region. Thus in the embodiment of FIG. 9B, the halo region collectively formed by stripes 922*a* and 922*b* is a region bordering two opposite edges of the designated area 912.

FIG. 9C illustrates yet other embodiments of halo regions, involving zones before and after the designated area or zone 913. For example, for the designated area 913, the halo region 923*b* may be chosen to be the zone prior to the zone for designated area 913. Halo region 923*c* illustrates that a halo may include multiple zones, such as the two zones after the designated area 913. Although the halo regions 923*b* and 923*c* are shown as non-overlapping with the designated area 913, in other embodiments, one or more of the zones may be overlapping with the designated area 913. In yet further embodiments, the halo regions can include equal-sized zones before or after the designated area 913, such as if halo regions 923*b* and 923*c* were each to include two zones. Other variations and combinations of the halo regions exemplified in FIGS. 9A-9C are possible. The halo regions are chosen to provide a context for calculations regarding temperatures and exposures of the designated area.

Returning to FIG. 8, surface temperature calculation step 823 involves determining a temperature of the first designated area at a second time period in the overall time period. The second time period is a time period at which secondary effects of exposure from a second shot group are received at the first designated area. The second time period may be before the first time period, simultaneous with the first time period, or after the first time period. In some embodiments, a plurality of transient temperatures of the target designated area at a plurality of time periods, such as a plurality of second time periods, may be determined. Each time period is a span of time at which an exposure from a shot group in the plurality of shot groups is received at the target designated area, where at least one shot group for which a transient temperature is determined is different from the target shot group. Calculation of the temperatures of the designated area that is under consideration utilizes heat diffusion analysis, with the charged particle beam shots as heat sources. The temperature at the designated area at a certain time point, or period, is a result of spatial and temporal heat effects over the surface. Although calculating the temperature of a certain location when a shot is delivered at the location is known in the art, calculating temperatures of the location at other time points during the writing of the overall surface has not been contemplated because the impact of temperature on secondary exposure effects has also not been contemplated in the simulation and correction of shots.

For step 823, in some embodiments a tree-structure may be utilized to systematically calculate the temperatures over time and space. To determine a temperature value for a particular location (i.e., a designated area), the analysis proceeds through the space-time tree in the neighborhood of that location. By traversing the tree, a list is built of what aggregation level (i.e., which leaves in the tree) will be used for this calculation. In certain embodiments, no aggregation is utilized; that is, all shot groups and details are calculated. Every shot group that has been received by the system is represented in one of the leaves of the tree-structure. A nearby leaf may or may not be included in the analysis of a designated area, depending on whether the leaf is close enough to have an effect on the designated area. The aggregation levels of the tree analysis may vary for the different designated areas being analyzed, and for different time periods at which exposure—whether forward scatter or secondary effects—is being received. The computations of temperature and exposure for each leaf relative to the point of interest are all independent.

Surface temperature calculation in step 823 may be performed at different scales or levels of detail, and incorporating different levels of halo effects. For example, in some embodiments, an entire stripe may be used as the designated area, and the whole stripe is computed in detail. The adjacent stripes above and below the designated stripe are used as context, or halo regions. In other embodiments, two zones are utilized. The neighboring zone is in the "halo" of the designated zone to be analyzed. In some embodiments, shot groups that are in neighboring sub-zones above and below the designated zone are analyzed. In other words, the overlapping of the zones creates stripes where the same data appears both in the above stripe and also in the below stripe. Other types of halo regions may be utilized, as described in reference to FIG. 6.

Thus, determining a temperature of a designated area at a certain time period in step 823 may involve approximating or estimating temperatures or a desired amount of shot correction depending on the level of detail needed, or depending on if there are situations where data on neighboring shots or shot groups may or may not be available. A shot correction may be by size, dose, exposure time, or any other forms of adjustment. The estimating may involve aggregating, or filtering, certain levels of detail as a trade-off between accuracy and computational time. In other words, in some embodiments the analysis may be chosen to have a cut-off level at which a certain level of detail is omitted in order to reduce processing time. In other embodiments, the analysis may be chosen to have a minimum accuracy level, requiring a higher level of detail to meet that accuracy target. In some embodiments, the estimating may involve a detailed calculation of a subset of the data, for example, data in a given set of zones, and extrapolating the effect to areas and time outside that zone by some formula. In other embodiments, there may only be estimations of shot correction for effects of temperature on secondary effects or the effects of secondary effects on temperature that are calculated without any temperature simulation.

The temperature calculations may be used to determine how the secondary effects of exposure will be affected. That is, the TEC step 820 may include determining secondary effects of exposure at a first designated area due to a second shot group, where the determining takes into account how the temperature of the first designated area at the second time period affects the secondary effects from the second shot group at the first designated area. In some embodiments, the secondary effects may be modeled as having an increased range of electrons scattering as the temperature of the designated area increases. These temperature-based secondary effects of exposure can then be used to more accurately simulate the pattern that will be formed on the surface. In other embodiments, the effect of secondary effects on temperature are ignored as being negligible.

The calculations in step 823 may also include conceptually determining a thermal map of the surface over the time that the surface is being exposed. The determining may be done in subsets of time and space, such as the time required to expose a stripe, a zone, or a sub-zone. Conceptually, the moving picture of the thermal map of the surface is computed. In some embodiments, approximations and estimations are used to reduce the computational requirements such as time, memory and communication bandwidth. In some embodiments, only temperatures of area and time that are relevant to shot correction are computed. In some embodiments, relevant temperatures for some area or span of time are aggregated. In some embodiments, the effect on temperature of the secondary effects are separately accounted for. In some embodiments, the effect on temperature of a shot group is modeled as a thermal injection of a certain strength and size, bundling all effects including those of secondary effects. In some embodiments, the accumulation and dissipation of heat in the surface, the underlying materials and the surrounding environment are simulated. Conceptually, the resulting dynamic thermal map provides the simulated temperatures required at any place at any time. In some embodiments, temperature of a designated area is computed only when secondary effects affecting it are received.

In some embodiments, the calculations in step 823 may include computing an effective temperature. In some embodiments, the effective temperature is determined using an exposure-weighted temperature. For example, each of the temperatures at a time of receiving forward scatter or secondary effects may have a compensation factor applied, such as by weighting with a temperature coefficient, based on the quantity of exposure received by the first designated area from each shot group. In some embodiments, the compensation factor or weighting value may be determined on a per case basis by looking at where the energy comes from for any particular location. Aggregation over time and space may be performed utilizing, for example, a weighted middle, or a geometric or time center, or any other method that improves accuracy. The effective temperature may be calculated as an integration over the overall time period as described in relation to Equation 1 for FIG. 7, in which determining an effective temperature involves summing the transient temperatures having applied exposure-based compensation factors, and dividing that sum by a sum of all exposures received by the first designated area during the overall time period.

In other embodiments, the exact temperature may be calculated at the time of the shot groups that a sub-zone or designated area is able to see—which is restricted because of run-time or other considerations—and the calculated number is used to make a refined guess of the local secondary effect temperature coefficient. The temperature coefficient can then be used with secondary effects received from other surrounding sub-zones it cannot see to estimate the total temperature effect from secondary effects of surrounding shot groups. In a further embodiment, some formula based on dose density or the total amount of secondary effects received may be used as a level of approximation instead of computing temperature at the time of secondary effects in favor of computing time.

The determination of an effective temperature may be performed using temperatures resulting from other shot groups, that occur either simultaneously or at different times as the area under consideration, either in the past or in the future or both. That is, for a first shot group having a first time period within the overall time period, the analysis may aggregate secondary effects of exposures from other shot groups occurring before the first time period, simultaneously with the first time period, or after the first time period.

In some embodiments, the determination of temperatures over time may be used as a temperature-based proximity effect correction method. While conventional PEC methods take into account the exposure due to secondary effects, in the present temperature-based PEC the methods take into account how the temperature of the first designated area at the time of the second shot group affects the secondary effects of exposure from the second shot group at the first designated area. In such embodiments, temperature-based PEC includes PEC step 814 along with steps 816 and 820, and therefore steps 822-826.

After the transient and spatial temperature profiles of the surface have been determined, the shot groups may be modified in shot group correction step 824 in order to more accurately produce the target patterns. In step 824, the combined temperature and exposure effect is determined for the designated area, and the shot list after TEC is output in step 826. The shot group correction step 824 may include modifying a shot in the target shot group, such as by modifying the dosage, based on the effective temperature of the target designated area. The exposure effect in step 824 is calculated as a combined point-spread function. In one embodiment, the modifying comprises applying a dose correction factor to the dose of one or more shots in the target shot group. In other embodiments, the correction factor may also be applied to multiple shot groups, or all shot groups. The correction factor may be a linear multiplication factor, or a higher-order operation. In yet other embodiments, the modifying may adjust the shape or positioning of shots to compensate for the secondary effects.

The temperature effect calculations and corrections of step 820 may be performed as inline, pipeline, or offline computing. These methodologies address how the TEC computation is performed in relation to the machine writing of the patterns. In embodiments where offline processing is used, all computations of TEC are completed, the entire mask's (or other surface) worth of shot dose data is stored, and then sent over to the machine to write using corrected doses. In embodiments where inline computing is used, computing occurs in the data processing flow of the machine, and/or processes the data as the writer is writing the shots in a pipelined way. In some embodiments, methods may include writing a pattern using a target shot group, and determining effective temperatures for other designated areas corresponding to other shot groups in the plurality of shot groups, where in-line computing is used in which the writing is performed while the determining of effective temperatures for the other shot groups is performed. For example, as the machine processes and performs other computations such as PEC, the TEC calculations are done on smaller sets of data. The machine proceeds to write those data sets while future regions are being processed by TEC. The smaller sets of data may be, for example, per stripe with a view of adjacent stripes (e.g. halo region); or in other embodiments, the data sets may be per zone with a prior zone plus a halo to extend into adjacent zones. Inline is inherently pipelined in sets of data. The larger the sets of data that are processed in a pipeline step, the bigger the latency. However, higher scale parallelization can be enabled to allow more sophisticated computing. For example, processing data per-stripe provides a great deal of accuracy compared to per zone. Per-zone data processing relies on more approximation but with less latency and less processing. Thus, the desired balance between accuracy and run-time can be chosen based on the specific situation. Inline can improve throughput, compared to offline where the computations may or may not be a part of the machine's data processing flow, and the machine processes the full chip completely before starting to write.

A charged particle beam system for performing the TEC step 820 may include 1) a device configured to receive data defining a plurality of shot groups that will be delivered by a charged particle beam writer during an overall time period, wherein a target shot group in the plurality of shot groups will be delivered onto a target designated area of a surface at a target time period; 2) a device configured to determine a plurality of transient temperatures of the target designated area at a plurality of time periods in the overall time period; 3) a device configured to determine an effective temperature of the target designated area based on the plurality of transient temperatures, the effective temperature being estimated, including the temperature of the target designated area during a second time period in which all or some of the secondary effects of exposure are being received at the target designated area, 4) a device configured to modify a shot in the target shot group based on the effective temperature of the target designated area; and 5) a device configured to form a pattern on the surface using the modified target shot group. The system may be configured to perform in-line processing, such that the pattern is formed using the target shot group while the steps of determining a plurality of transient temperatures and determining an effective temperature are performed for additional designated areas corresponding to additional shot groups in the plurality of shot groups.

In some embodiments, the determination of an effective temperature may be an iterative process. After shot group correction is performed in step 824, surface temperature calculation in step 823 could then be performed again using the modified shots as shown by the dotted line in FIG. 8. In one embodiment, an approximation factor can be used to take the iteration into account.

The shot list 826 after TEC may optionally undergo other dose or shape modification in additional shot modification step 828. The resulting final shot list with adjusted dosage 830 is used to generate a surface in a mask writing step 832, which uses a charged particle beam writer such as an electron beam writer system. Depending on the type of charged particle beam writer being used, TEC refinement 820 and optional dose or shape modification in step 828 may be performed by the charged particle beam writer. Mask writing step 832 may comprise a single exposure pass or multiple exposure passes. The electron beam writer system projects a beam of electrons through a stencil onto a surface to form a mask image 834 comprising patterns on the surface. The completed surface may then be used in an optical lithography machine, which is shown in a step 836. Finally, in a step 838, an image on a substrate such as a silicon wafer is produced.

The calculations described or referred to in this disclosure may be accomplished in various ways. Generally, calculations may be accomplished by in-process, pre-process or post-process methods. In-process calculation involves performing a calculation at the time when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is pre-calculating a shot configuration that will produce a minimum CD variation for a given situation, and storing information about this shot configuration in a table. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In other embodiments the pre-calculation may comprise calculation of resist or substrate heating, or thermal variation. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

The fracturing, mask data preparation, thermal effect calculations/corrections, shot list modification and pattern formation flows described in this disclosure may be implemented using general-purpose computers using Central Processing Units (CPU) with appropriate computer software as computation devices. For example, the steps of determining a plurality of transient temperatures receiving data defining a plurality of shot groups, determining an effective temperature, and modifying a shot in the target shot group may be performed by a computing hardware processor. Due to the large amount of calculations required, multiple computers or processor cores of a CPU may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. Specialty computing hardware devices or processors may include, for example, field-programmable gate arrays (FPGA), application-specific integrated circuits (ASIC), or digital signal processor (DSP) chips. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

Figure 10:
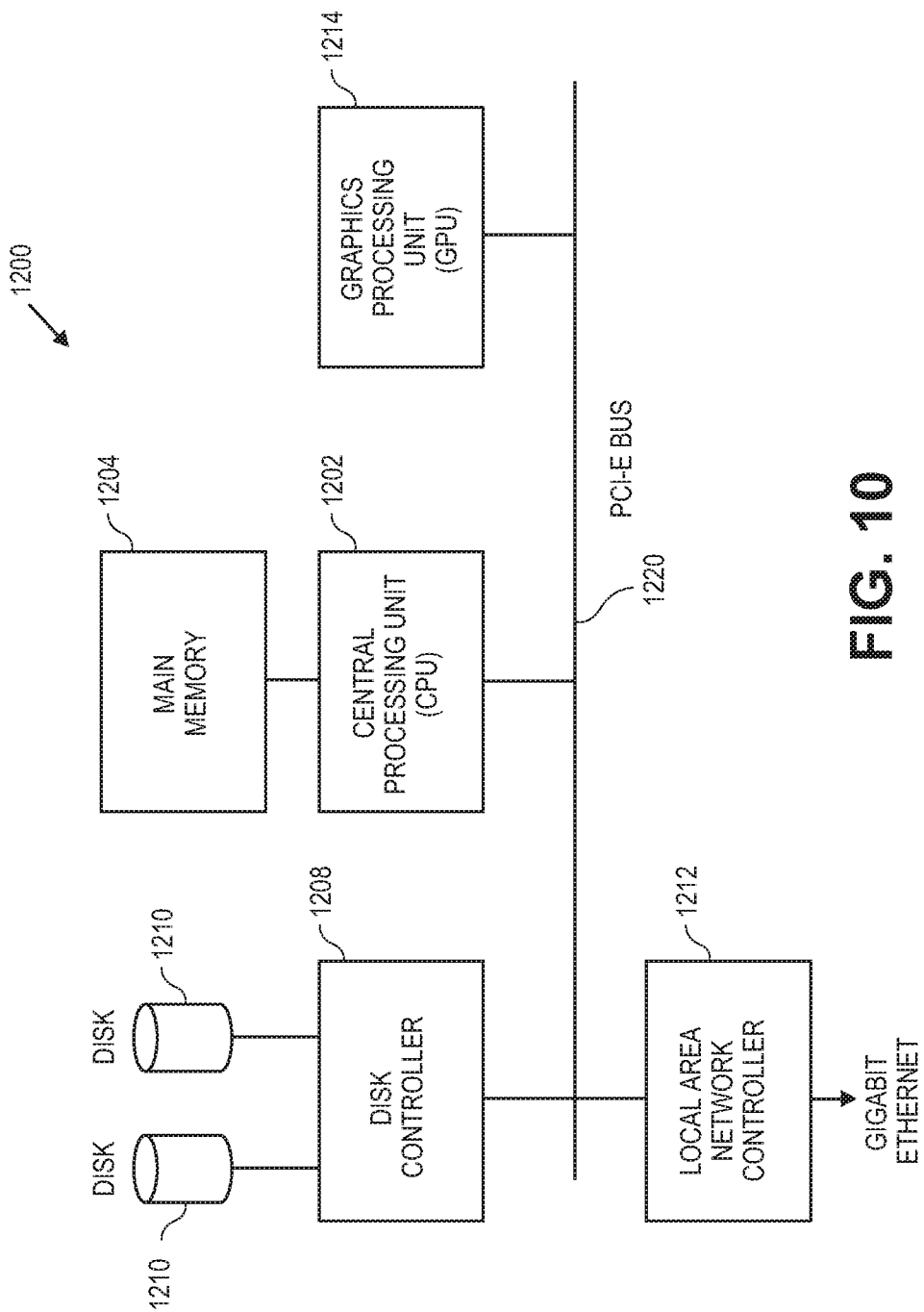
FIG. 10 illustrates an exemplary computing hardware device used in embodiments of the methods.

FIG. 10 illustrates an example of a computing hardware device 1200 that may be used to perform the calculations described in this disclosure. Computing hardware device 1200 comprises a central processing unit (CPU) 1202, with attached main memory 1204. The CPU may comprise, for example, eight processing cores, thereby enhancing performance of any parts of the computer software that are multi-threaded. The size of main memory 1204 may be, for example, 64 G-bytes. The CPU 1202 is connected to a Peripheral Component Interconnect Express (PCIe) bus 1220. A graphics processing unit (GPU) 1214 is also connected to the PCIe bus. In computing hardware device 1200 the GPU 1214 may or may not be connected to a graphics output device such as a video monitor. If not connected to a graphics output device, GPU 1214 may be used purely as a high-speed parallel computation engine. The computing software may obtain significantly-higher performance by using the GPU for a portion of the calculations, compared to using CPU 1202 for all the calculations. The CPU 1202 communicates with the GPU 1214 via PCIe bus 1220. In other embodiments (not illustrated) GPU 1214 may be integrated with CPU 1202, rather than being connected to PCIe bus 1220. Disk controller 1208 may also be attached to the PCIe bus, with, for example, two disks 1210 connected to disk controller 1208. Finally, a local area network (LAN) controller 1212 may also be attached to the PCIe bus, and provides Gigabit Ethernet (GbE) connectivity to other computers. In some embodiments, the computer software and/or the design data are stored on disks 1210. In other embodiments, either the computer programs or the design data or both the computer programs and the design data may be accessed from other computers or file serving hardware via the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, shot list modification, and forming a pattern on a surface may be practiced by those of ordinary skill in the art, without departing from the scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method comprising:
   receiving data defining a plurality of shot groups that will be delivered by a charged particle beam writer during an overall time period, wherein a first shot group in the plurality of shot groups will be delivered onto a first designated area of a surface at a first time period in the overall time period, a second shot group in the plurality of shot groups will be delivered onto a second designated area at a second time period that is after the first time period, and secondary effects of exposure from the second shot group are received at the first designated area at the second time period;
   determining a temperature of the first designated area at the second time period in the overall time period, wherein the determining of the temperature includes calculation of heating due to exposure from the first shot group and heat diffusion from the plurality of shot groups;
   determining the secondary effects of exposure received at the first designated area at the second time period due to the second shot group, wherein the determining of the secondary effects comprises increasing the secondary effects as the temperature of the first designated area increases; and
   modifying at least one shot in the first shot group to be delivered at the first time period based on the determining of the temperature and the determining of the secondary effects at the second time period;
   wherein the secondary effects of exposure from the second shot group comprise one of the group consisting of long-range effects and mid-range effects, the long-range effects including backscattering, and the mid-range effects including EUV scattering effects; and
   wherein the receiving, the determining of the temperature and the determining of the secondary effects are performed by a computing hardware processor.

2. The method of claim 1, wherein the determining a temperature is performed for a plurality of time periods in the overall time period, wherein exposure is received by the first designated area at each time period; and
   wherein the method further comprises determining an effective temperature of the first designated area based on the temperatures of the first designated area at each time period in the plurality of time periods, wherein the determining of an effective temperature comprises applying a compensation factor to the temperature of the first designated area at each time period, the compensation factor at each time period being based on an amount of exposure received by the first designated area during that time period.

3. The method of claim 2, wherein the exposure received by the first designated area at each time period is an exposure type comprising one of the group consisting of forward scatter and the secondary effects, the secondary effects including backscatter; and
   wherein the compensation factor is additionally dependent on the exposure type.

4. The method of claim 1, wherein each shot group in the plurality of shot groups comprises one or more individual charged particle beam shots; and
    wherein the charged particle beam writer is a single beam writer or a multi-beam writer.

5. The method of claim 1, wherein the first designated area is defined by one of the group consisting of: a chip, a stripe, a zone, or a sub-zone.

6. The method of claim 1, wherein the determining of the secondary effects comprises increasing a range of electron scattering as the temperature of the first designated area increases.

7. A method comprising:
    receiving data defining a plurality of shot groups that will be delivered by a charged particle beam writer during an overall time period, wherein a target shot group in the plurality of shot groups will be delivered onto a target designated area of a surface at a target time period in the overall time period;
    determining a plurality of transient temperatures of the target designated area at a plurality of time periods, each time period being a span of time at which an exposure from a shot group in the plurality of shot groups is received at the target designated area, wherein the determining of the plurality of transient temperatures includes calculation of heating due to exposure from the target shot group and heat diffusion from the plurality of shot groups, and wherein at least one shot group for which a transient temperature is determined i) is delivered at a time period after the target time period, and ii) causes an exposure received by the target designated area that comprises secondary effects, the secondary effects including backscatter;
    determining an effective temperature of the target designated area for the overall time period, the effective temperature being determined by using the plurality of transient temperatures and applying a compensation factor to the transient temperature at each time period, the compensation factor being based on an amount of the exposure received by the target designated area during that time period; and
    modifying a shot in the target shot group based on the effective temperature of the target designated area;
    wherein the receiving, the determining a plurality of transient temperatures, the determining an effective temperature, and the modifying are performed by a computing hardware processor.

8. The method of claim 7, wherein the modifying comprises applying a dose correction factor to a dose of the shot in the target shot group.

9. The method of claim 7, wherein the determining an effective temperature comprises summing the transient temperatures having the applied exposure-based compensation factors, and dividing the sum by a sum of all exposures received by the target designated area during the overall time period.

10. The method of claim 9, wherein the exposure received by the target designated area at each time period is an exposure type comprising one of the group consisting of forward scatter and the secondary effects; and
    wherein the compensation factor is additionally dependent on the exposure type.

11. The method of claim 7, further comprising:
    writing a pattern using the target shot group after the step of modifying; and
    determining effective temperatures for other designated areas corresponding to other shot groups in the plurality of shot groups;
    wherein the method comprises in-line computing in which the writing is performed while the determining of effective temperatures for the other shot groups is performed.

12. The method of claim 11, wherein the computing hardware processor comprises a graphics processing unit.

13. A method comprising:
    receiving data defining a plurality of shot groups that will be delivered by a charged particle beam writer during an overall time period, wherein a first shot group in the plurality of shot groups will be delivered onto a first designated area of a surface at a first time period in the overall time period; and
    determining a temperature of the first designated area at a second time period, the second time period being a time that is after the first time period and at which secondary effects of exposure from a second shot group in the plurality of shot groups are received at the first designated area, wherein the determining of the temperature includes calculation of heating due to exposure from the first shot group and heat diffusion from the plurality of shot groups; and
    performing a temperature-based proximity effect correction (PEC) on the first shot group, the temperature-based PEC taking into account how the temperature of the first designated area at the second time period affects the secondary effects of exposure from the second shot group at the first designated area.

14. The method of claim 13, wherein the temperature-based PEC comprises increasing the secondary effects as the temperature of the first designated area increases.

15. A system comprising:
    a device that receives data defining a plurality of shot groups that will be delivered by a charged particle beam writer during an overall time period, wherein a target shot group in the plurality of shot groups will be delivered onto a target designated area of a surface at a target time period;
    a device that determines a plurality of transient temperatures of the target designated area at a plurality of time periods in the overall time period, wherein the determining of the plurality of transient temperatures includes calculation of heating due to exposure from the target shot group and heat diffusion from the plurality of shot groups, and wherein at least one time period in the plurality of time periods is after the target time period and is a time period at which secondary effects of exposure from a second shot group in the plurality of shot groups are received at the target designated area;
    a device that determines an effective temperature of the target designated area for the overall time period by using the plurality of transient temperatures and applying a compensation factor to the transient temperature at each time period, the compensation factor being based on an amount of exposure, including secondary effects, received by the target designated area during that time period; and
    a device that modifies a shot in the target shot group based on the effective temperature of the target designated area.

16. The system of claim 15, further comprising:
    a device that forms a pattern on the surface using the modified target shot group.

17. The system of claim 16, wherein the system performs in-line processing, wherein the pattern is formed using the target shot group while the device that determines the plurality of transient temperatures and the device that determines the effective temperature determine the plurality of transient temperatures and the effective temperature for additional designated areas corresponding to additional shot groups in the plurality of shot groups.

* * * * *

UNITED STATES PATENT AND TRADEMARK OFFICE
CERTIFICATE OF CORRECTION

| | | |
|---|---|---|
| PATENT NO. | : 10,460,071 B2 | Page 1 of 1 |
| APPLICATION NO. | : 15/298464 | |
| DATED | : October 29, 2019 | |
| INVENTOR(S) | : Akira Fujimura et al. | |

It is certified that error appears in the above-identified patent and that said Letters Patent is hereby corrected as shown below:

On the Title Page

Item (54) and in the Specification, Column 1, Lines 1-2, in the title please insert --METHOD AND SYSTEM FOR FORMING PATTERNS USING-- before "SHAPED BEAM LITHOGRAPHY INCLUDING TEMPERATURE EFFECTS"

Signed and Sealed this
Eleventh Day of February, 2020

Andrei Iancu
*Director of the United States Patent and Trademark Office*